(12) United States Patent
Kojima

(10) Patent No.: US 8,254,435 B2
(45) Date of Patent: Aug. 28, 2012

(54) MODULATION METHOD AND MODULATOR USING PULSE EDGE SHIFT

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 1030 days.

(21) Appl. No.: 12/200,911

(22) Filed: Aug. 28, 2008

(65) Prior Publication Data
US 2010/0054350 A1 Mar. 4, 2010

(51) Int. Cl.
*H03K 7/08* (2006.01)

(52) U.S. Cl. ........ 375/238; 375/239; 375/246; 375/253; 375/295; 455/115.1; 332/112

(58) Field of Classification Search .......... 375/237–240, 375/242, 244, 246, 253, 254, 256, 295, 296; 332/112, 106, 115; 455/91, 113, 115.1
See application file for complete search history.

(56) References Cited

U.S. PATENT DOCUMENTS

| | | | |
|---|---|---|---|
| 7,295,594 B1 * | 11/2007 | Lohr | 375/130 |
| 7,869,769 B2 * | 1/2011 | Stengel et al. | 455/76 |
| 2010/0290517 A1 * | 11/2010 | Lee et al. | 375/239 |

* cited by examiner

*Primary Examiner* — Dac Ha
(74) *Attorney, Agent, or Firm* — Martine Penilla Group, LLP

(57) ABSTRACT

A variable delay circuit delays a carrier signal having a predetermined frequency, and outputs a modulated signal. A delay setting unit sets a delay period for the variable delay circuit according to a data signal to be modulated. The delay setting unit assigns each symbol in the data signal to any one of positive edges and negative edges in the carrier signal, and sets a delay period for the variable delay circuit at the timing at which a positive edge in the carrier signal passes through the variable delay circuit, according to the symbol value in the data signal assigned to the positive edge. Furthermore, the delay setting unit sets a delay period for the variable delay circuit at the timing at which a negative edge in the carrier signal passes through the variable delay circuit, according to the symbol value in the data signal assigned to the negative edge.

12 Claims, 13 Drawing Sheets

MODULATION METHOD AND MODULATOR USING PULSE EDGE SHIFT

BACKGROUND OF THE INVENTION

1. Field of the Invention

The present invention relates to a modulation/demodulation technique.

2. Description of the Related Art

Methods for converting a data signal to be transmitted into a pulse train can be roughly classified into techniques whereby information is carried on the amplitude of a signal, and techniques whereby the information is carried along the time axis of the signal. Known examples of the latter techniques include pulse position modulation (PPM), pulse width modulation (PWM), frequency modulation (FM), PFM (pulse frequency modulation), pulse interval modulation (PIM), etc. For example, PPM is employed in communication using optical fibers or infrared remote controllers, etc. PWM is employed in switching power supplies, the power control operation for single-bit digital audio amplifiers, etc.

In the wireless communication field, examples of the methods for transmitting data using a phase shift of the sinusoidal carrier wave, instead of the pulse thereof, include PSK (Phase Shift Keying), DPSK (Differential Phase Shift Keying), GMSK (Gaussian Filtered Minimum Shift Keying), QAM (Quadrature Amplitude Modulation), OFDM (Orthogonal Frequency Division Multiplexing), etc.

Through an ideal transmission line of tens of cm on a printed circuit board, conventional architectures provide a transmission rate of around 20 Gbps.

In recent years, there has come to be an increase in the amount of data to be transmitted, and such data has come to be transmitted at a higher speed. This leads to a demand for implementing techniques for transmitting data at even higher bit rates.

SUMMARY OF THE INVENTION

The present invention has been made in view of such a situation. Accordingly, it is a general purpose of the present invention to provide a modulation/demodulation technique which offers high-speed data transmission.

An embodiment of the present invention relates to a modulation method. In the method, the following steps are performed.

1a. A data signal to be modulated is generated.
1b. A carrier signal having a predetermined frequency is generated.
1c. Each symbol in the data signal is assigned to any one of positive edges or negative edges in the carrier signal.
1d. A positive edge in the carrier signal is delayed by a delay period according to a symbol value in the data signal assigned to the positive edge. Furthermore, a negative edge in the carrier signal is delayed by a delay period according to a symbol value in the data signal assigned to the negative edge. Thus, a modulated signal is generated.

With such an embodiment, by delaying (shifting) each of the positive edge and the negative edge in a pulse according to the value of a data signal, data for two symbols can be carried in each pulse cycle. Thus, such an embodiment provides high-speed data transmission.

With the modulation method according to such an embodiment, in the Step 1d, the following Step 2 may be executed.

2. When the modulated signal is generated, the delay period to be applied to at least one of the positive edge and the negative edge is adjusted giving consideration to loss in a transmission line via which the modulated signal is transmitted.

The term "transmission line" includes wiring, an optical fiber, and the atmosphere, etc. In a case of employing wiring, single-ended transmission or differential transmission can be employed as a transmission system. The transmission of an electrical signal or an optical signal via a transmission line can lead to waveform distortion. Accordingly, in some cases, there is a difference in the pulse properties (pulse width, amplitude, edge slope, etc.) of the modulated signal between the receiving side which receives the modulated signal and the transmitting side. In this case, by adjusting the delay period to be applied to either the positive edges or the negative edges or by adjusting the delay periods to be applied to both the positive edges and the negative edges, so as to apply pre-distortion, the transmission rate can be improved.

Also, with the modulation method according to such an embodiment, in the Step 1d, the following Step 3 may be executed.

3. When the modulated signal is generated, the delay period to be applied to at least one of the positive edge and the negative edge is adjusted according to the pulse width of the modulated signal obtained as the modulation result.

In a case in which the transmission line has known electrical or electromagnetic properties, the relation between the pulse width at the transmitting terminal and the pulse width at the receiving terminal can be obtained based upon simulation results or experimental results. Thus, the transmission rate can be improved by applying pre-distortion according to the pulse width of the modulated signal.

Also, with the modulation method according to such an embodiment, in the Step 1d, the following steps may be executed.

4a. The difference between the delay period to be applied to the edge which precedes a given edge according to the data signal and the delay period to be applied to the given edge according to the data signal is calculated.
4b. A compensation period is determined according to the difference thus calculated.
4c. The delay period, which is to be applied to the given edge according to the corresponding data signal, is compensated using the compensation period, and the delay period thus compensated is applied to the given edge.

Another embodiment of the present invention relates to a modulator. The modulator comprises: a variable delay circuit which outputs a modulated signal by delaying a carrier signal having a predetermined frequency; and a delay setting unit which sets the delay period for the variable delay circuit according to a data signal to be modulated. The delay setting unit assigns each symbol included in the data signal to any one of positive edges and negative edges included in the carrier signal. Furthermore, the delay setting unit sets a delay period for the variable delay circuit at the timing at which a given positive edge in the carrier signal passes through the variable delay circuit, according to a symbol value in the data signal assigned to the positive edge. Moreover, the delay setting unit sets a delay period for the variable delay circuit at the timing at which a given negative edge in the carrier signal passes through the variable delay circuit, according to a symbol value in the data signal assigned to the negative edge.

With such an embodiment, each of the positive edges and the negative edges included in the carrier signal is delayed according to the corresponding data signal.

Also, the delay setting unit may include: a delay element which delays the data signal, which is sequentially input, by one cycle; a computation unit which calculates the difference between a delay period that corresponds to the data signal which has not been delayed and a delay period that corresponds to the data signal which has been delayed; a compensation period determination unit which determines a compensation period based upon the difference thus calculated by the computation unit; and a delay compensation unit which compensates for the delay period that corresponds to the data signal which has not been delayed, using the compensation period thus determined by the compensation period determination unit, thereby determining the compensated delay period. The delay setting unit may set the compensated delay period for the variable delay circuit.

The compensation period determination unit may include a table which stores the relation between the aforementioned difference and the compensation period.

The table may be determined based upon the pulse width of the modulated signal output from the variable delay circuit and the pulse width of the modulated signal which reaches the demodulation circuit via the transmission line.

The delay setting unit may set the delay period in proportion to the value of the data signal.

Yet another embodiment of the present invention relates to a modulation method. In this method, the following steps are performed.
10a. A data signal to be modulated is generated.
10b. A carrier signal is generated at a predetermined frequency.
10c. A modulated signal is generated by delaying an edge selected from a positive edge and a negative edge by a delay period that corresponds to the data signal.

With such an embodiment, after the shift amount (delay amount) to be applied to either the positive edge or the negative edge is changed according to the data signal, the data is transmitted. Such an embodiment provides a reduced transmission rate, which is theoretically half that of the transmission rate of an arrangement in which both the positive edge and the negative edge are shifted. However, such an embodiment has the advantage of simplified modulation processing and simplified demodulation processing.

With the modulation method according to such an embodiment, in the Step 10c, the following Step 11 may be executed.
11. When the modulated signal is generated, the delay period to be applied to an edge selected from a positive edge and a negative edge is adjusted giving consideration to the loss in a transmission line via which the modulated signal is transmitted.

With the modulation method according to such an embodiment, in the Step 10c, the following Step 12 may be executed.
12. When the modulated signal is generated, the delay period to be applied to the edge thus selected is adjusted according to the pulse width of the modulated signal obtained as the modulation result.

Yet another embodiment of the present invention relates to a modulator. The modulator comprises: a variable delay circuit which outputs a modulated signal by delaying a carrier signal having a predetermined frequency; and a delay setting unit which sets a delay period for the variable delay circuit according to a data signal to be modulated. The delay setting unit sets a delay period for the variable delay circuit according to a symbol value in the data signal at the timing at which an edge in the carrier signal, selected from a positive edge and a negative edge, passes through the variable delay circuit. Furthermore, the delay setting unit sets a delay period for the variable delay circuit to a predetermined value independent of a symbol value in the data signal at the timing at which a different edge which has not been selected passes through the variable delay circuit.

Such an embodiment suitably delays the edges that belong to a single edge type, which has been selected from the positive edge type and the negative edge type, according to a data signal.

The delay setting unit may adjust the delay period to be applied to the edge thus selected, giving consideration to loss in the transmission line via which the modulated signal is transmitted.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

1. First Embodiment

Figure 1:
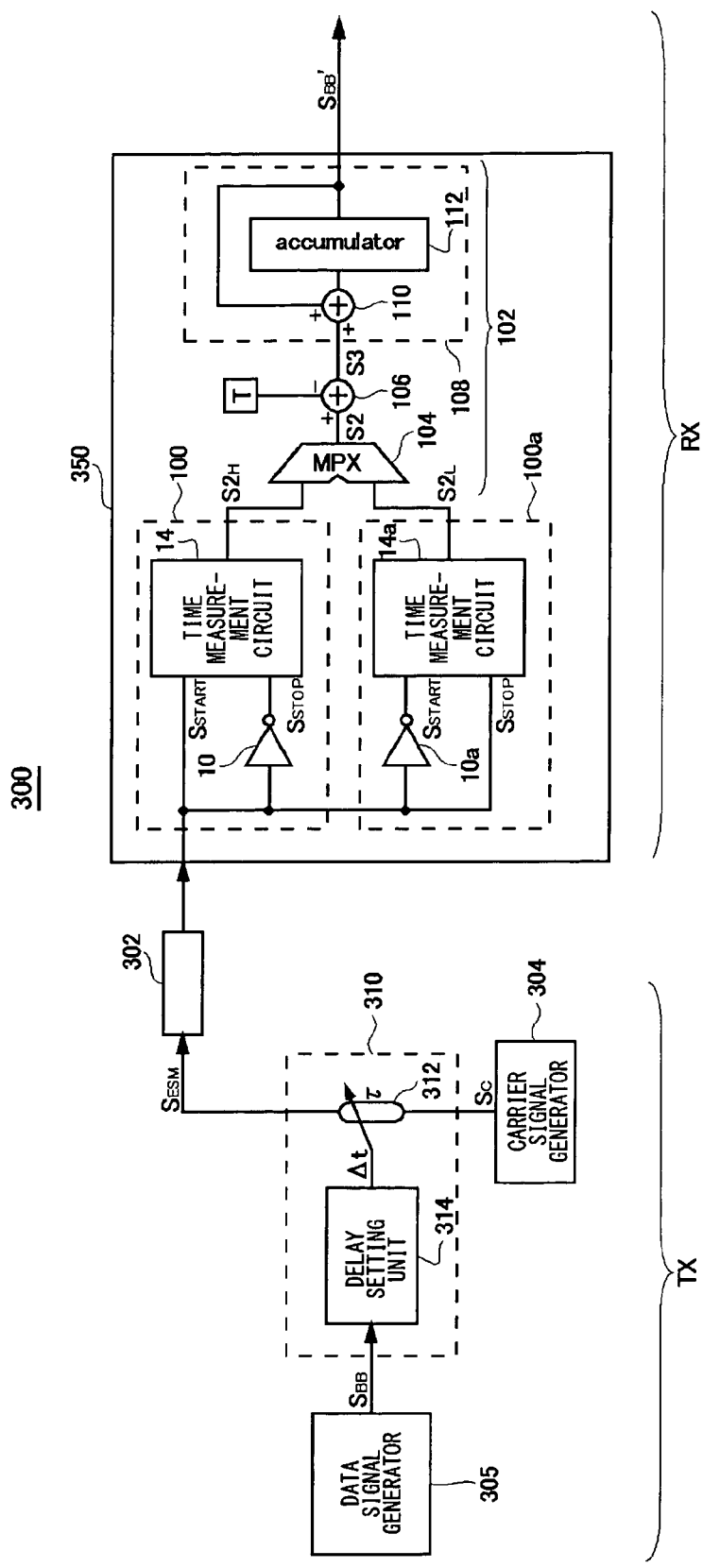
FIG. 1 is a block diagram which shows a configuration of a transmission system according to a first embodiment.

FIG. 1 is a block diagram which shows a configuration of a transmission system 300 according to a first embodiment. The transmission system 300 includes a first device (which will also be referred to as a "transmission device") TX, a second device (which will also be referred to as a "receiving device") RX, and a transmission medium 302. The transmission system 300 shifts the positions of edges of a carrier signal Sc having a predetermined frequency according to a data signal (which will also be referred to as a "base band signal" hereafter) $S_{BB}$ used as a modulation signal so as to carry information using the position of the edge. That is the reason why this modulation method will also be referred to as "edge shift modulation (ESM)" in the present specification. Although the ESM technique resembles PWM in a certain aspect, it will become evident from the following description that ESM is an essentially distinct technique from PWM.

It should be noted that examples of the transmission medium 302 include an optical fiber, the atmosphere, etc., in addition to wiring. In a case of employing wiring, single-ended transmission or differential transmission can be employed as a transmission system.

1.1 Modulator

First, description will be made regarding the configuration and the operation of the transmitter side, i.e., the modulator side. Here, in order to facilitate understanding, description will be made regarding digital modulation as an example. Also, the same idea can be applied to analog modulation, which can be understood by those skilled in this art.

The transmission device TX includes a carrier signal generator 304, a data signal generator 305, and a modulator 310. The carrier signal generator 304 generates a carrier signal $S_C$ at a predetermined frequency $f_c$. The data signal generator 305 generates the data signal $S_{BB}$ to be transmitted to the receiving device RX.

The modulator 310 receives the carrier signal $S_C$ and the base band signal $S_{BB}$, and performs edge shift modulation processing on the carrier signal $S_C$ using the base band signal $S_{BB}$ as a modulation signal. The modulator 310 includes a variable delay circuit 312 and a delay setting unit 314.

The variable delay circuit 312 delays the carrier signal $S_C$ by a delay amount set beforehand. The delay setting unit 314 sets the delay period τ for the variable delay circuit 312 according to the base band signal $S_{BB}$ to be modulated. The configuration of the variable delay circuit 312 is not restricted in particular. Rather, various known techniques can be employed.

The delay setting unit 314 is capable of setting respective delay amounts Δt independent of one another for the positive edge and the negative edge in the carrier signal $S_C$ that passes through the variable delay circuit 312. The delay amount to be applied to the positive edge will be represented by τp, and the delay amount to be applied to the negative edge will be represented by τn.

In a case in which the base band signal $S_{BB}$ consists of symbols each of which is composed of m-bit data, the variable delay circuit 312 is configured such that it is capable of switching the delay amount for the positive edge and the negative edge in increments of at least $2^m$ steps.

For example, with regard to the two time-adjacent symbols $S_{BB}[i]$ and $S_{BB}[i+1]$ in the base band signal, the delay setting unit 314 assigns the former symbol $S_{BB}[i]$ to the positive edge, and assigns the latter symbol $S_{BB}[i+1]$ to the negative edge. Put more simply, the delay setting unit 314 is capable of assigning the symbols in the base band signal $S_{BB}$ to the positive edge and the negative edge in an alternating manner with respect to time.

Then, at the timing at which the positive edge passes through the variable delay circuit 312, the delay setting unit 314 sets the delay period τp for the variable delay circuit 312 according to the symbol value A[i] in the base band signal $S_{BB}[i]$ assigned to the positive edge. Furthermore, at the timing at which the negative edge passes through, the delay setting unit 314 sets the delay period τn according to the other symbol value A[i+1] in the base band signal $S_{BB}[i+1]$ assigned to the negative edge.

The signal having an edge timing thus shifted by the variable delay circuit 312 is output as a modulated signal $S_{ESM}$.

Figure 2:
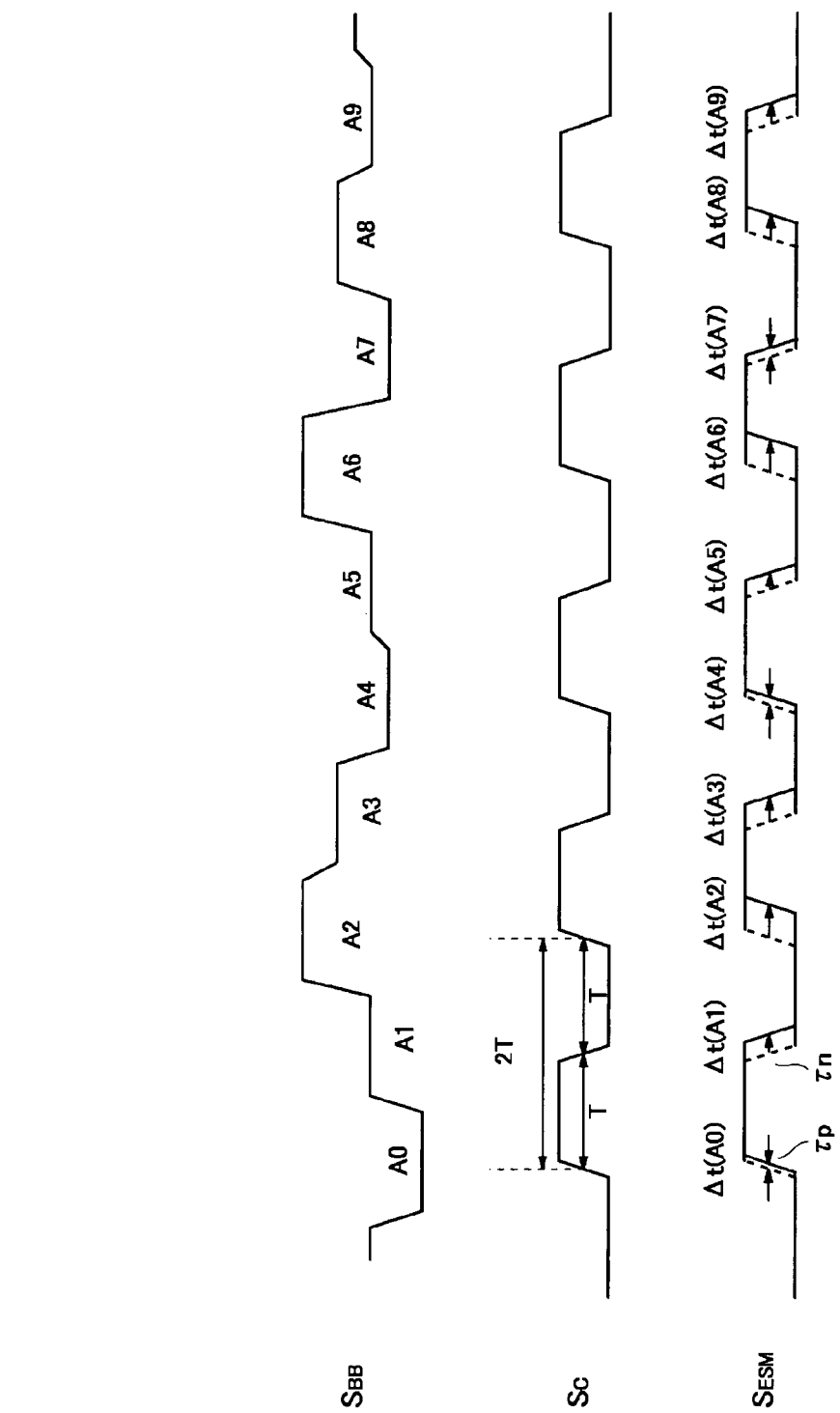
FIG. 2 is a waveform diagram which shows an ESM signal generated using a modulation method according to the first embodiment.

The above is the configuration of the modulator 310. Next, description will be made regarding the waveform of the modulated signal (which will be referred to as the "ESM signal" hereafter) $S_{ESM}$ generated using the ESM technique and the operation of the modulator 310. FIG. 2 is a waveform diagram which shows the ESM signal $S_{ESM}$ generated using the modulation method according to the first embodiment.

Beginning at the top, FIG. 2 shows the base band signal $S_{BB}$, the carrier signal $S_C$, and the ESM signal $S_{ESM}$. The carrier signal $S_C$ has a duty ratio of 50%. That is to say, the high-level period T matches the low-level period T, and the carrier signal $S_C$ has a cycle period of 2T (=1/$f_c$). The base band signal $S_{BB}$ is shown in increments of symbols. Each of the positive and negative edges is assigned to one symbol. The half cycle period will be represented by "T" hereafter.

Synchronously with the carrier signal $S_C$, the delay setting unit 314 sets the delay amount Δt(A) according to the symbol value A in the base band signal $S_{BB}$. By synchronizing the carrier signal $S_C$ and the base band signal $S_{BB}$ with each other, all the edges in the carrier signal $S_C$ can be used to carry information. With such an arrangement, the symbol rate $f_{SYM}$ of the base band signal $S_{BB}$ is twice the frequency $f_C$ of the carrier signal $S_C$. It should be noted that an arrangement may be made employing the base band signal $S_{BB}$ and the carrier signal $S_C$ without synchronizing these signals with each other. Although such an arrangement employing the base band signal $S_{BB}$ and the carrier signal $S_C$ without synchronizing these signals with each other has the disadvantage of a reduced transmission rate, such an arrangement is also capable of transmitting a signal.

For example, the variable delay circuit 312 may set the delay amount Δt(A) in proportion to the symbol value A. Also, the variable delay circuit 312 may set the delay amount Δt(A) according to other rules that differ from the proportion rule.

With the ESM described in the present embodiment, both the negative edges and the positive edges in the carrier signal $S_C$ can be used to carry information, thereby providing high-speed data transmission.

Next, description will be made regarding a modification of the modulator 310 which is effective in providing a satisfactory transmission rate in order to deal with a situation in which the transmission line has poor performance or a situation in which the signal is to be transmitted over a long distance.

In a case of transmitting a signal over a long distance using an electric signal as the transmission medium 302 shown in FIG. 1, the waveform of the signal is dulled due to loss in the transmission line. As a result, when a narrow pulse reaches the receiving terminal, the pulse width of the narrow pulse becomes narrower. In addition, when a wide pulse reaches the receiving terminal, the pulse width of the wide pulse becomes wider.

Figure 3A:
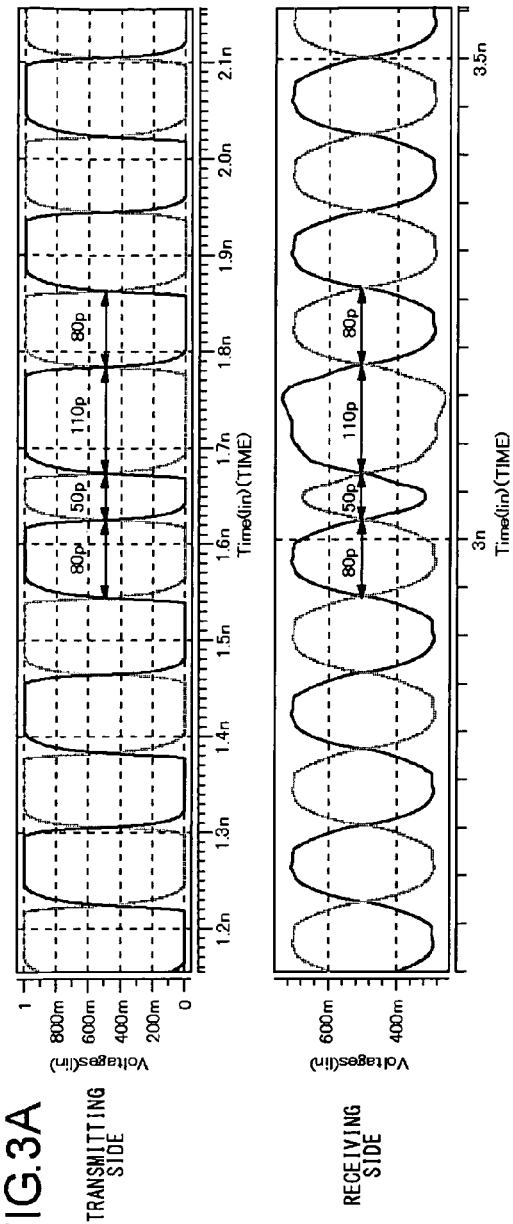
FIGS. 3A and 3B are graphs which show simulations of the waveforms at a transmitting terminal and a receiving terminal in a state in which the ESM signal is transmitted via a differential transmission line formed on a printed circuit board.
Figure 3B:
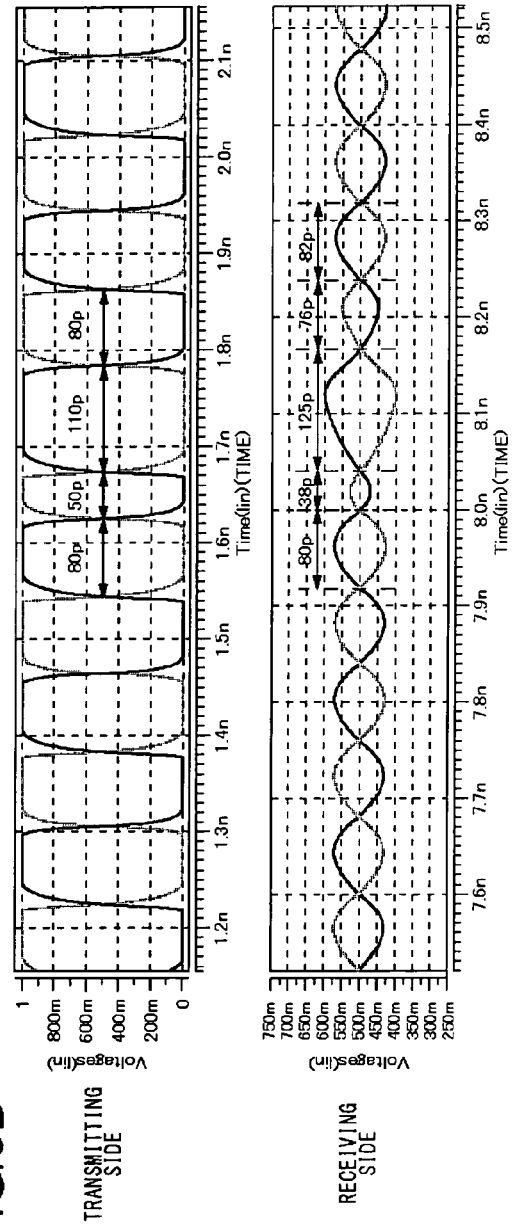

FIGS. 3A and 3B show simulations of the waveforms of the ESM signals at the transmission terminal and the receiving terminal when they are transmitted via a differential path formed on a printed circuit board. FIGS. 3A and 3B show simulation results for transmission lines of 20 cm and 1 m, respectively. As shown in FIG. 3A, after the signal is transmitted over the transmission length of 20 cm, the waveform decays slightly in the amplitude direction. That is to say, when a pulse having a pulse width of 50 ps reaches the receiving terminal, it maintains the pulse width of 50 ps. On the other hand, when the transmission length is 1 m, the amplitude decays to around ⅓ of its original amplitude. In this case, when a pulse transmitted from the transmitting terminal having a pulse width of 50 ps reaches the receiving end, the pulse width becomes narrower, i.e., 38 ps. In addition, it can be understood that, when a wide pulse transmitted from the transmitting terminal having a pulse width of 110 ps reaches the receiving end, the pulse width becomes wider, i.e., 125 ps.

Figure 4:
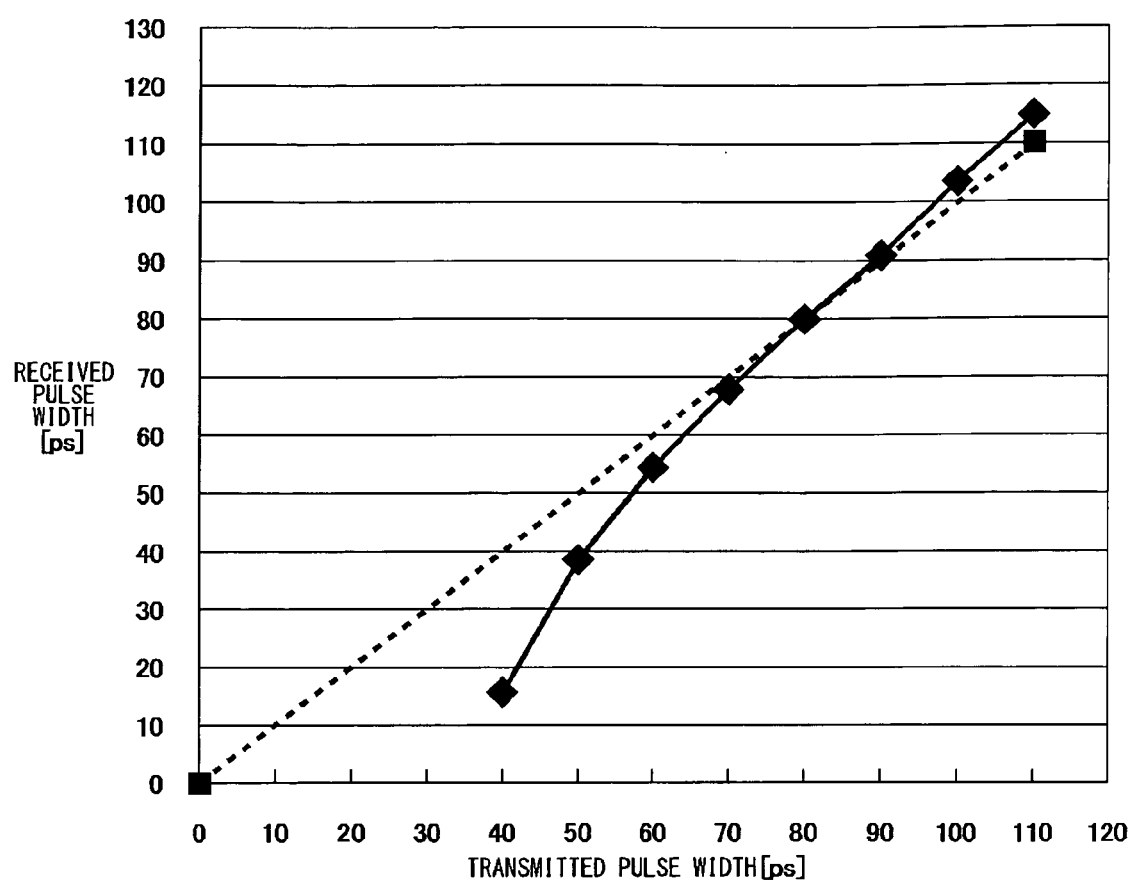
FIG. 4 is a graph which shows the relation between the transmission pulse width and the reception pulse width when the ESM signal is transmitted via a transmission line.

FIG. 4 is a graph which shows the relation between the transmission pulse width and the reception pulse width when the ESM signal propagates through a transmission line. The horizontal axis represents the transmission pulse width, and the vertical axis represents the reception pulse width. In FIG. 4, the relation therebetween when a signal is transmitted via a lossless transmission line is shown by the broken line. The relation shown in FIG. 4 can be obtained by measuring the pulse width at the receiving terminal while changing the pulse width at the transmission terminal in the transmission system 300 including the transmission medium 302.

In order to compensate for distortion of the waveform due to loss in the transmission line, the modulator according to the modification compensates for the pulse width of the ESM signal $S_{ESM}$ at the transmission terminal such that the pulse width of the ESM signal $S_{ESM}$ at the receiving terminal matches the pulse width transmitted without involving transmission loss.

Specifically, when the ESM signal $S_{ESM}$ is generated on the transmitting side, the modulator according to the modification adjusts the delay period to be applied to at least one of the positive edge and the negative edge, giving consideration to loss in the transmission medium 302 via which the ESM signal $S_{ESM}$ is transmitted.

Seen from a different perspective, the delay period to be applied to at least one of the positive edge and the negative edge is adjusted according to the pulse width (transmission pulse width) of the ESM signal $S_{ESM}$ obtained as a result of modulation.

The pulse width compensation is provided by the following processing.

1. Calculation of the difference ($\tau p - \tau n$) between the delay amount $\tau p (= \Delta t(A))$ to be applied to the positive edge in the carrier signal $S_C$ and the delay amount $\tau n (= \Delta t(A))$ to be applied to the negative edge in the carrier signal $S_C$.

2. Compensation for the delay amount to be applied to each of the positive edge and the negative edge in the carrier signal $S_C$ using the compensation delay period $\tau_{COMP}$ that corresponds to the difference ($\tau p - \tau n$) thus calculated.

When a positive edge in the carrier signal $S_C$ is delayed by $\tau p$, and the subsequent negative edge is delayed by $\tau n$, the pulse width (high-level period) TH of the ESM signal $S_{ESM}$ is represented by the following Expression using the half cycle period T.

$TH = T - (\tau p - \tau n)$

In the same way, when a negative edge in the carrier signal $S_C$ is delayed by $\tau n$, and the subsequent positive edge is delayed by $\tau p$, the pulse width (low-level period) TL of the ESM signal $S_{ESM}$ is represented by the following Expression using the half cycle period T.

$TL = T + (\tau p - \tau n)$

As described above, the difference ($\tau p - \tau n$) calculated in Step 1 indicates the modulation component provided by the ESM, i.e., the period of time by which the pulse width of the ESM signal is increased or reduced from the half cycle period T. The delay amount for the preceding positive edge (or negative edge) and the delay amount for the subsequent negative edge (or positive edge) are set according to the two time-adjacent symbol values A[n−1] and A[n] in the base band signal $S_{BB}$, respectively. That is to say, the modulation component ($\tau p - \tau n$) can be calculated based upon the two symbol values A[n] and A[n−1] included in the base band signal $S_{BB}$.

Figure 5:
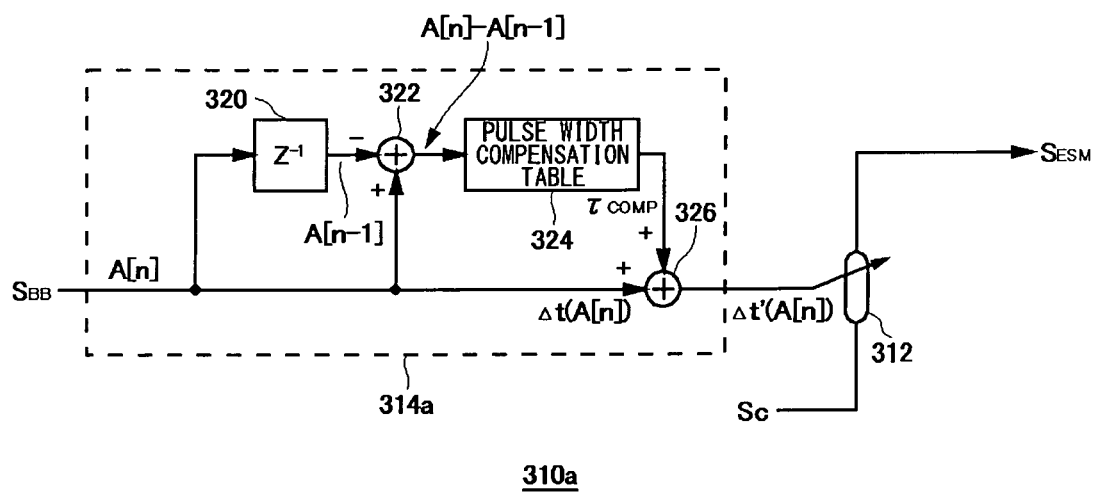
FIG. 5 is a circuit diagram which shows a configuration of a modulator according to a modification.

FIG. 5 is a circuit diagram which shows the configuration of a modulator 310a according to the modification. In the modulator 310a, a delay setting unit 314a executes the following processing.

1. Calculation of the difference between the delay period $\Delta t(A[n])$ to be applied to the n'th edge according to the corresponding symbol value A[n] in the data signal $S_{BB}$ and the delay period $\Delta t(A[n-1])$ to be applied to the preceding (n−1)'th edge according to the corresponding symbol value A[n−1] in the data signal $S_{BB}$.

2. Determination of the compensation delay period $\tau_{COMP}$ corresponding to the difference $\Delta t(A[n]) - \Delta t(A[n-1])$ thus calculated.

3. Compensation for the delay period $\Delta t(A[n])$, which is to be applied to the n'th edge according to the corresponding symbol value A[n] in the data signal $S_{BB}$, using the compensation delay period $\tau_{COMP}$, and application of the compensated delay period $\Delta t(A[n])' (= \Delta t(A[n]) + \tau_{COMP})$ to the n'th edge.

In order to execute this processing, the delay setting unit 314a includes a delay element 320, a computation unit 322, a compensation period determination unit 324, and a delay compensation unit 326.

The delay element 320 delays the base band signal $S_{BB}$, which is sequentially input, by one cycle (one symbol). This one symbol matches the half cycle period T of the carrier signal $S_C$.

The computation unit 322 calculates the difference data (A[n]−A[n−1]) which indicates the difference between the delay period $\Delta t(A[n])$ that corresponds to the n'th symbol value A[n] included in the base band signal $S_{BB}$ without being subjected to the delay processing and the delay period $\Delta t(A[n-1])$ that corresponds to the (n−1)'th symbol value A[n−1] subjected to the delay processing.

The compensation period determination unit 324 determines the compensation period $\tau_{COMP}$ according to the difference data (A[n]−A[n−1]) calculated by the computation unit 322. The compensation period determination unit 324 includes a table. The table stores the relation between the difference Δt(A[n])−Δt(A[n−1]) and the compensation period $\tau_{COMP}$. It should be noted that the compensation period determination unit 324 may calculate the compensation period $\tau_{COMP}$ by performing computation processing.

Using the compensation period $\tau_{COMP}$ thus determined, the delay compensation unit 326 compensates for the delay period Δt(A[n]) that corresponds to the n'th symbol value A[n] which has not been delayed, thereby generating the compensated delay period Δt(A[n])'. The delay setting unit 314a sets the compensated delay period Δt(A[n])' for the variable delay circuit 312.

Figure 6:
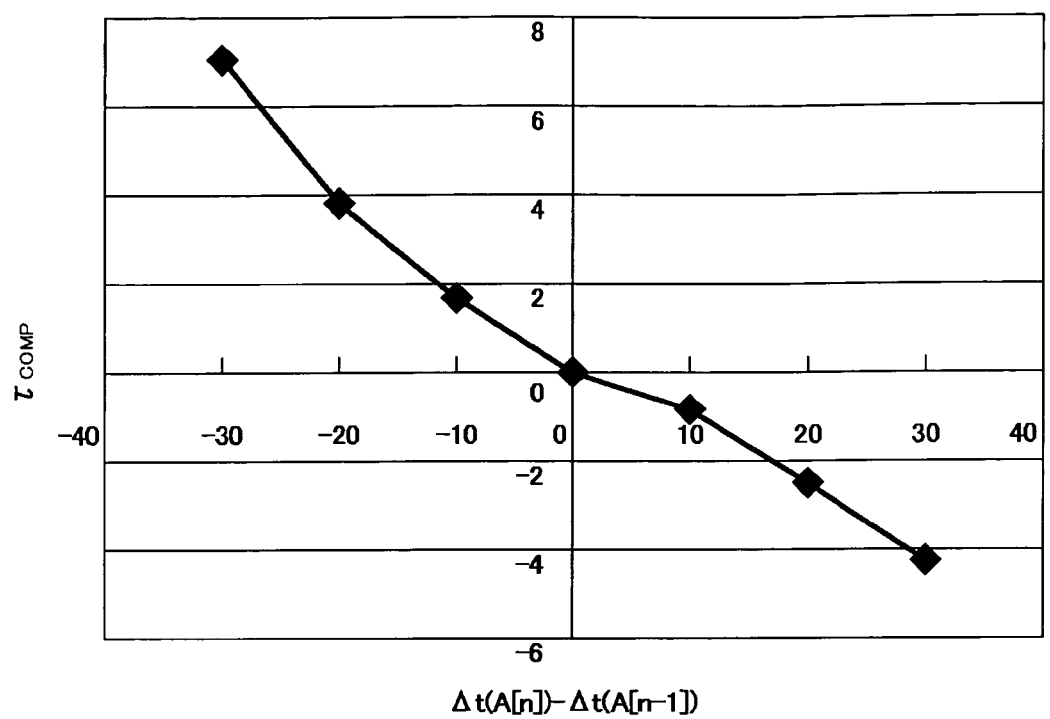
FIG. 6 is a graph which shows the relation between the data sets stored in a compensation table of a compensation period determination unit.

Next, description will be made regarding a method for creating the compensation table. FIG. 6 is a graph which shows the relation between the data items held by the compensation table in the compensation period determination unit 324. In FIG. 6, the horizontal axis represents the difference Δt(A[n])−Δt(A[n−1]), and the vertical axis represents the compensation period $\tau_{COMP}$. The compensation table can be derived from the correlation between the pulse width on the transmitting side and the pulse width on the receiving side as shown in FIG. 4.

Here, let consider an arrangement in which the symbol value A included in the base band signal $S_{BB}$ can be set to any one of four values, i.e., [00], [01], [10], and [11], and the delay amounts that correspond to these four values are represented by the following Expressions.

Δt(A[00])=0 ps

Δt(A[01])=10 ps

Δt(A[10])=20 ps

Δt(A[11])=30 ps

In a case in which the half cycle period T of the carrier signal $S_C$ is 80 ps, the pulse width (high-level period TH) of the positive pulse (high-level pulse) and the pulse width (low-level period TL) of the negative pulse (low-level pulse) of the ESM signal $S_{ESM}$, which are obtained as a result of the modulation, can be set to one of seven periods, i.e., 50 ps, 60 ps, 70 ps, 80 ps, 90 ps, 100 ps, and 110 ps.

Referring to FIG. 4, it can be understood that, in order to obtain the pulse widths of 50 ps, 60 ps, 70 ps, 80 ps, 90 ps, 100 ps, and 110 ps, the transmitting terminal should transmit pulses with pulse widths of 57.1 ps, 63.8 ps, 71.8 ps, 80 ps, 89.5 ps, 97.5 ps, and 105.5 ps, respectively.

That is to say, the compensation period $\tau_{COMP}$ necessary for providing these pulse widths are represented by the following Expressions.

57.1 p−50=7.1 ps 63.8−60=3.8 ps 71.8−70=1.8 ps

80−80=0 ps 89.5−90=−0.5 ps 97.5−100=−2.5 ps and 105.5−110=−4.5 ps

The difference Δt(A[n])−Δt(A[n−1]) can be obtained by subtracting the half cycle period T of the carrier signal $S_C$ from the pulse width that is desired at the receiving terminal. The compensation table shown in FIG. 6 is obtained by plotting the relation between the difference Δt(A[n])−Δt(A[n−1]) and the compensation period $\tau_{COMP}$.

The optimized delay amount Δt(A) can be obtained on the receiving side (demodulation side) by adding the compensation period $\tau_{COMP}$ thus determined to the delay amount Δt(A) that corresponds to the base band signal $S_{BB}$. Such an arrangement improves the demodulation precision and the transmission rate.

The compensation table can be created by executing the following sequence. That is to say, the transmission device TX transmits the ESM signal with a certain pulse width. The receiving device RX notifies the transmission device TX of the pulse width of the ESM signal thus received. The transmission device TX creates a table based upon the relation between the pulse width of the pulse thus transmitted and the pulse width received as a notice.

This sequence may be automatically performed on the transmission device TX side when it is powered up. Also, this sequence may be performed in the operation state according to a predetermined sequence. Also, an arrangement may be made in which, in the operation state, an instruction is transmitted at a desired timing from the receiving device RX to the transmission device TX to create a table, and the aforementioned sequence is executed according to the instruction.

The above is the description regarding the modification of the first embodiment. Description will be made returning to FIG. 1. The modulated signal $S_{ESM}$ generated by the modulator 310 is transmitted via the transmission medium 302, and is input to the receiving device RX. Next, description will be made regarding the demodulator which demodulates the ESM signal $S_{ESM}$ thus received.

1.2 Demodulator

A demodulator 350 includes a first pulse width measurement circuit 100, a second pulse width measurement circuit 100a, and a computation processing unit 102.

The first pulse width measurement circuit 100 measures the high-level period TH of the modulated signal (ESM signal) $S_{ESM}$, i.e., the period from the positive edge up to the negative edge in the ESM signal $S_{ESM}$, and generates a first time difference signal S2$_H$ according to the high-level period TH thus measured. The second pulse width measurement circuit 100a measures the low-level period TL of the modulated signal (ESM signal) $S_{ESM}$, i.e., the period from the negative edge up to the positive edge in the ESM signal $S_{ESM}$, and generates a second time difference signal S2$_L$ according to the low-level period TL thus measured.

The first pulse width measurement circuit 100 includes a first inverter 10 and a first time measurement circuit 14. The first inverter 10 inverts the ESM signal $S_{ESM}$. The first time measurement circuit 14 receives the ESM signal $S_{ESM}$ and the inverted ESM signal #$S_{ESM}$ (the symbol "#" indicates logical inversion) as a start signal $S_{START}$ and a stop signal $S_{STOP}$, respectively. The first time measurement circuit 14 measures the time difference between the positive edge in the start signal $S_{START}$ and the positive edge in the stop signal $S_{STOP}$. The time difference thus measured matches the high-level period (pulse width) TH of the ESM signal $S_{ESM}$.

In the same way, the second pulse width measurement circuit 100a includes a second inverter 10a and a second time measurement circuit 14a. The second inverter 10a inverts the ESM signal $S_{ESM}$. The second time measurement circuit 14a receives the inverted ESM signal #$S_{ESM}$ and the ESM signal $S_{ESM}$ as the start signal $S_{START}$ and the stop signal $S_{STOP}$, respectively. The second time measurement circuit 14a measures the time difference between the positive edge in the start signal $S_{START}$ and the positive edge in the stop signal $S_{STOP}$. The time difference thus measured matches the low-level period (pulse width) TL of the ESM signal $S_{ESM}$.

Each of the time measurement circuit 14 and the time measurement circuit 14a outputs a signal (which will be referred to as a "time difference signal" hereafter) S2 according to the time difference τ between the positive edge in the start signal $S_{START}$ and the positive edge in the stop pulse signal $S_{STOP}$. For example, a TDC (TDC: Time to Digital Converter) disclosed in U.S. Pat. No. 4,719,608 or a similar TDC can be suitably employed in the time measurement circuit 14. However, the present invention is not restricted to such an arrangement. Also, the time measurement circuit 14 may be a TAC (TAC: Time to Analog Converter) which measures the time difference between the edges using analog signal processing. In the TAC, the technique disclosed in U.S. Pat. No. 4,408,166 can be employed, for example. That is to say, the time measurement circuit 14 may output the time difference signal S2 in the form of either a digital value or an analog value.

The computation processing unit 102 receives the first time difference signal $S2_H$ and the second time difference signal $S2_L$, and demodulates the data signal (base band signal $S_{BB}$) based upon these time difference signals. Specifically, the computation processing unit 102 repeatedly alternates between performing step (1), in which the high-level period $T_CH$ of the carrier signal $S_C$ is subtracted from the high-level period TH of the ESM signal $S_{ESM}$ indicated by the first time difference signal $S2_H$, and step (2), in which the low-level period $T_CL$ of the carrier signal $S_C$ is subtracted from the low-level period TL of the ESM signal $S_{ESM}$ indicated by the second time difference signal $S2_L$.

Then, the computation processing unit 102 cumulatively adds the values obtained for every subtraction, thereby demodulating the base band signal $S_{BB}$ according to the integrated value.

The processing at the computation processing unit 102 can be provided by the following configuration, for example. The computation processing unit 102 includes a selector 104, a subtractor 106, and an integrator 108.

The selector 104 receives the first time difference signal $S2_H$ and the second time difference signal $S2_L$, and alternates between selecting these time difference signals SH2 and SL2 synchronously with the ESM signal $S_{ESM}$ at a symbol rate of $f_{SYM}$.

It should be noted that, in the present embodiment, the duty ratio of the carrier signal $S_C$ is 50%, and the high-level period $T_CH$ and the low-level period $T_CL$ satisfy the following relation.

$T_CH = T_CL = T$

Accordingly, the subtractor 106 subtracts the half cycle period T of the carrier signal $S_C$ from the time difference (TH or TL) that corresponds to the time difference signal S2 ($S2_H$ or $S2_L$) output from the selector 104.

The integrator 108 cumulatively adds the output signal S3 of the subtractor 106. The integrator 108 may include an adder 110 and an accumulator 112. The integrator 108 outputs the base band signal $S_{BB}'$ thus demodulated.

Figure 7:
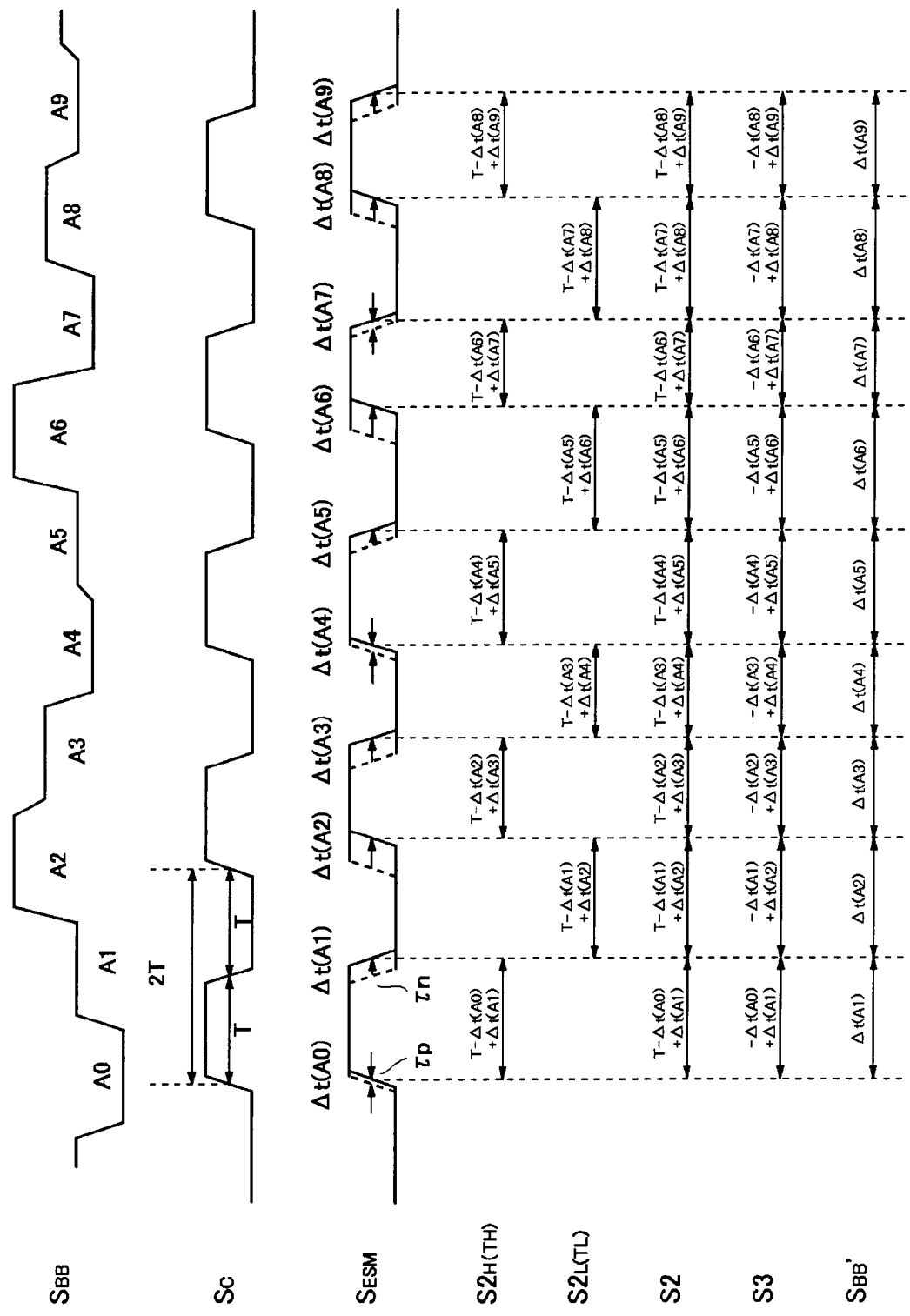
FIG. 7 is a time chart which shows demodulation processing performed by the demodulator shown in FIG. 1.

The above is the configuration of the demodulator 350. Next, description will be made regarding the operation thereof. FIG. 7 is a time chart which shows the demodulation processing performed by the demodulator 350 shown in FIG. 1. In order to simplify the description and in order to facilitate understanding, FIG. 7 shows a case in which Δt(Δ0)=0. However, the present invention is not restricted to such a case in which Δt(Δ0)=0. Before the demodulation processing, the integrator 108 is initialized, and the value stored in the integrator 108 is zero-cleared. When the modulated ESM signal $S_{ESM}$ is input, the high-level period TH and the low-level period TL are measured alternately. The high-level period TH and the low-level period TL are multiplexed by the selector 104. Then, each of the high-level period TH and the low-level period TL are subjected to subtraction processing in which the half cycle period is subtracted, thereby generating the data S3 which indicates the change in the pulse width. By cumulatively adding the change in the pulse width, such an arrangement provides a signal $S_{BB}'$ which indicates the shift amount (delay amount) for each of the positive edges and the negative edges. As can be clearly understood from FIG. 7, the signal $S_{BB}'$ matches the base band signal $S_{BB}$ on the modulation side.

As described above, the demodulator 350 shown in FIG. 1 demodulates a signal subjected to edge shift modulation, thereby demodulating the base band signal $S_{BB}'$.

Next, description will be made regarding a modification of the demodulator 350.

Figure 8A:
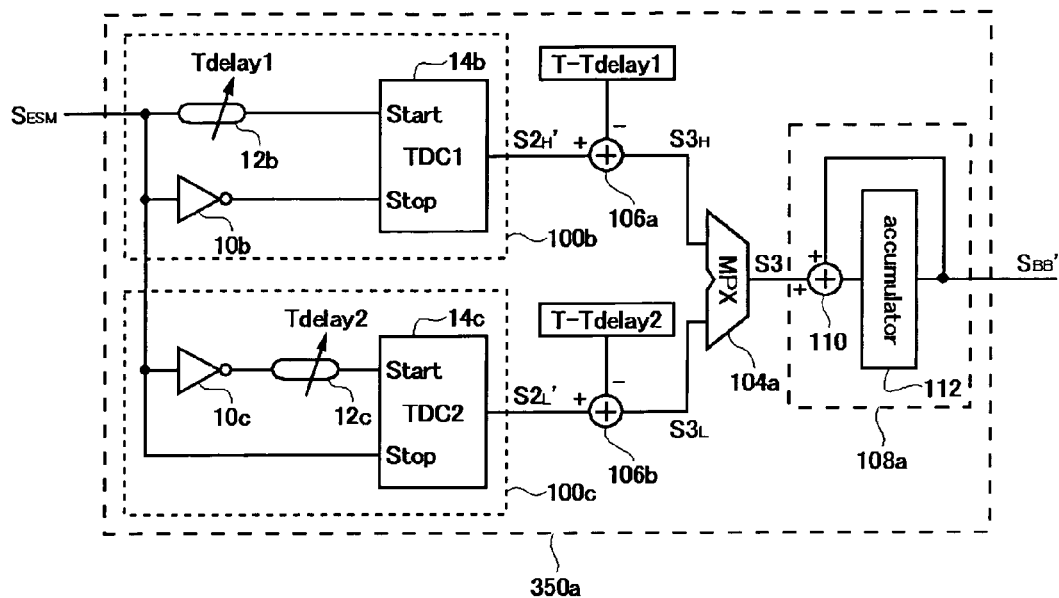
FIGS. 8A and 8B are circuit diagrams which show the configurations of the demodulators according to first and second modifications.
Figure 8B:
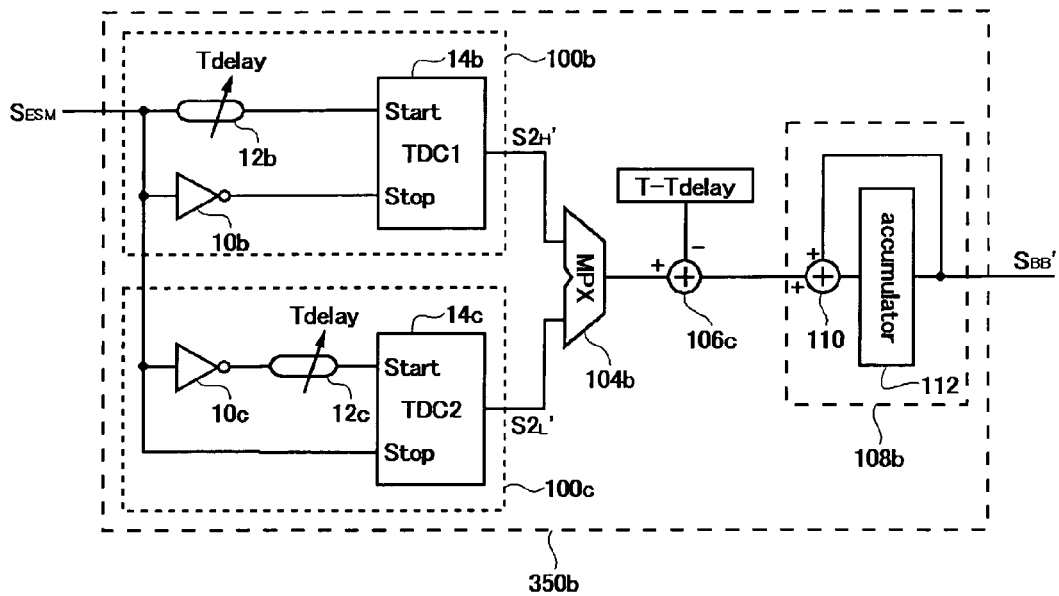

FIGS. 8A and 8B are circuit diagrams which show the configurations of modulators according to a first modification and a second modification.

Description will be made referring to FIG. 8A. A demodulator 350a according to the first modification includes a first pulse width measurement circuit 100b, a second pulse width measurement circuit 100c, a first subtractor 106a, a second subtractor 106b, a selector 104a, and an integrator 108a.

The first pulse width measurement circuit 100b includes a first delay circuit 12b, in addition to the configuration of the first pulse width measurement circuit 100 shown in FIG. 1. The first delay circuit 12b applies a predetermined first delay period Tdelay1 to the ESM signal (modulated signal) $S_{ESM}$. The ESM signal $S_{ESM}$ thus delayed is input as the start signal $S_{START}$ to the first time measurement circuit 14b. The first time measurement circuit 14b outputs a time difference signal $S2_H'$ according to the time difference between the start signal $S_{START}$ and the stop signal $S_{STOP}$.

The second pulse width measurement circuit 100c includes a second delay circuit 12c, in addition to the configuration of the second pulse width measurement circuit 100a shown in FIG. 1. The second delay circuit 12c applies a predetermined second delay period Tdelay2 to the inverted ESM signal (modulated signal) #$S_{ESM}$ inverted by the second inverter 10c. The inverted ESM signal #$S_{ESM}$ thus delayed is input as the start signal $S_{START}$ to the second time measurement circuit 14c. The second time measurement circuit 14c outputs a time difference signal $S2_L'$ according to the time difference between the start signal $S_{START}$ and the stop signal $S_{STOP}$.

The first subtractor 106a subtracts a predetermined period (T−Tdelay1) from the time difference τ indicated by the first time difference signal $S2_H'$, and outputs a signal S3H according to the value obtained as the subtraction result.

In the same way, the second subtractor 106b subtracts a predetermined period (T−Tdelay2) from the time difference τ indicated by the second time difference signal $S2_L'$, and outputs a signal S3L according to the value obtained as the subtraction result.

The selector 104a alternates between selecting the signals S3H and S3L, synchronously with the ESM signal $S_{ESM}$ at a symbol rate $f_{SYM}$, in the same way as in the selector 104 shown in FIG. 1. The integrator 108a cumulatively adds the output signal S3 of the selector 104a, in the same way as in the integrator 108 shown in FIG. 1. The integrator 108a outputs the demodulated base band signal $S_{BB}'$.

Figure 9:
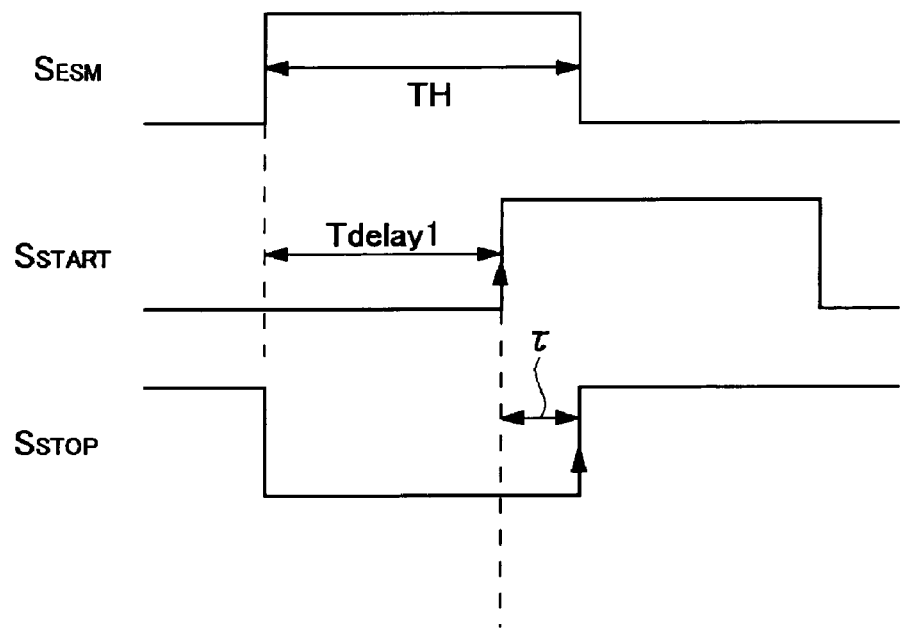
FIG. 9 is a time chart which shows the operation of a first pulse width measurement circuit shown in FIG. 8A.

FIG. 9 is a time chart which shows the operation of the first pulse width measurement circuit 100b shown in FIG. 8A. As can be clearly understood from FIG. 9, the pulse width (high-level period) TH, which is to be measured by the first pulse width measurement circuit 100b, is represented by the following Expression using the time difference τ between the start signal $S_{START}$ and the stop signal $S_{STOP}$.

$$TH=\tau+Tdelay1$$

Accordingly, with such an arrangement, the first pulse width measurement circuit 100b measures the time difference τ, and the subsequent component adds the delay amount Tdelay1 to the time difference τ, thereby obtaining the high-level period TH of the ESM signal $S_{ESM}$. Furthermore, by subtracting the half cycle period T from the high-level period TH, the modulated component Δt(A) can be obtained.

The same is true of the second pulse width measurement circuit 100c.

The first pulse width measurement circuit 100b (or second pulse width measurement circuit 100c) provides a wide measurement range for the pulse width while maintaining a high measurement resolution. This advantage can be clearly understood by making a comparison with a circuit which has no delay circuit 12b (12c). Here, description will be made regarding the configuration and the operation of the first pulse width measurement circuit 100b.

Description will be made assuming that the time measurement circuit 14a is capable of measuring the time difference τ between the positive edge in the start signal $S_{START}$ and the positive edge in the stop signal $S_{STOP}$ with a resolution of Δt and with a maximum gradation level of m (m represents an integer). In this case, the upper limit of the measurement range of the time measurement circuit 14 is represented by the Expression; m×Δt.

In a case in which the first pulse width measurement circuit 100b does not include the delay circuit 12b, the upper limit of the pulse width THmax' which can be measured by the first pulse width measurement circuit 100b is represented by the following Expression.

$$TH\text{max}'=m\times\Delta t$$

For example, in a case in which Δt=1 ps, and m=20, the maximum pulse width which can be measured is 20 ps. In order to increase the maximum pulse width which can be measured to 100 ps while maintaining the resolution, such an arrangement requires a maximum gradation level of m=100. This leads to an increase in the circuit area. Alternatively, in order to increase the maximum pulse width which can be measured to 100 ps while maintaining the maximum gradation level of m, there is a need to lower the resolution Δt to 5 ps.

On the other hand, in a case in which the first pulse width measurement circuit 100b includes the delay circuit 12b, the upper limit THmax of the pulse width TH of the input pulse signal PULSE which can be measured by the first pulse width measurement circuit 100b is represented by the following Expression.

$$TH\text{max}=Tdelay1+m\times\Delta t$$

In a case in which Tdelay is 80 ps, the maximum pulse width which can be measured is increased to 100 ps while maintaining the same resolution Δt(=1 ps) and the same maximum gradation level m (=20), as compared with an arrangement which does not include the delay circuit 12b. Also, in a case in which the same pulse width THmax' is provided while maintaining the same maximum gradation level m (=20) as with an arrangement which does not include the delay circuit 12, by setting the delay amount Tdelay1 to 10 ps, such an arrangement raises the resolution Δt to 0.5 ps. Also, by setting the Tdelay1 to 10 ps while maintaining the resolution Δt(=1 ps), the maximum gradation level m can be reduced to 10, thereby reducing the circuit scale.

As described above, the first and second pulse width measurement circuits 100b and 100c shown in FIG. 8A provide high-resolution and high-range measurement without involving a tradeoff between the resolution Δt and the maximum gradation level m.

Seen from a different perspective, the first and second pulse width measurement circuits 100b and 100c shown in FIG. 8A have the advantage of optimizing the measurement range by changing the delay amounts Tdelay1 and Tdelay2 according to the half cycle period of the carrier signal $S_C$.

Description will be made referring to FIG. 8B. A demodulator 350b according to the second modification includes a first pulse width measurement circuit 100b, a second pulse width measurement circuit 100c, a selector 104b, a subtractor 106c, and an integrator 108b.

The demodulator 350b shown in FIG. 8B has the same configuration, except that the positions of the selector 104b and the subtractor 106c are switched. In a case in which the delay amount Tdelay to be applied by the first delay circuit 12b is equal to the delay amount Tdelay to be applied by the second delay circuit 12c, by sharing the subtractor 106c, the circuit area can be reduced.

Figure 10A:
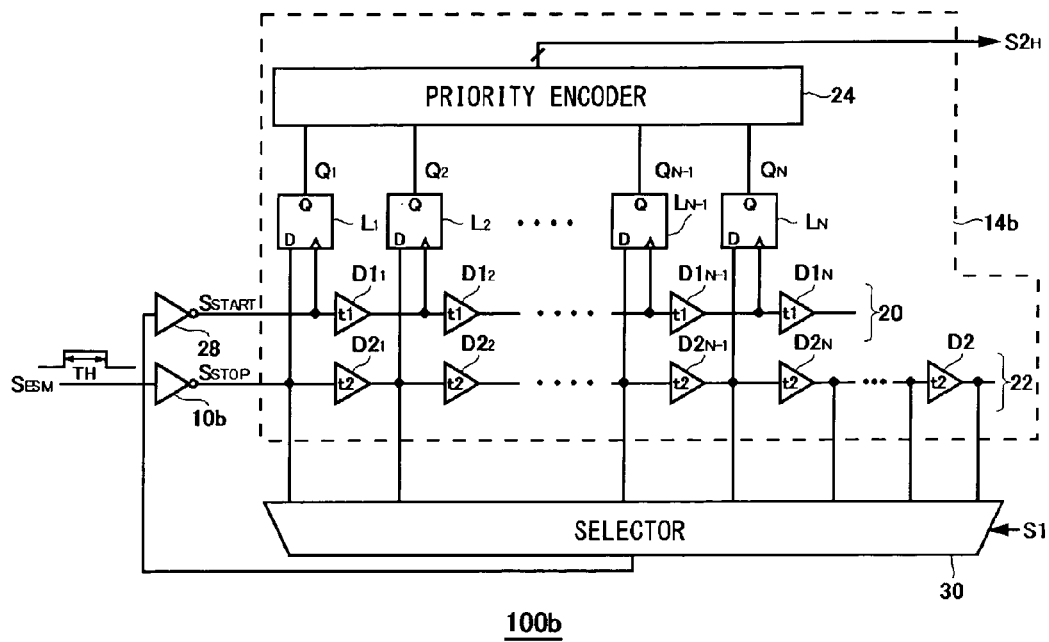
FIGS. 10A and 10B are circuit diagrams which show modification examples of the first pulse width measurement circuit and the second pulse width measurement circuit used in the circuits shown in FIGS. 8A and 8B.
Figure 10B:
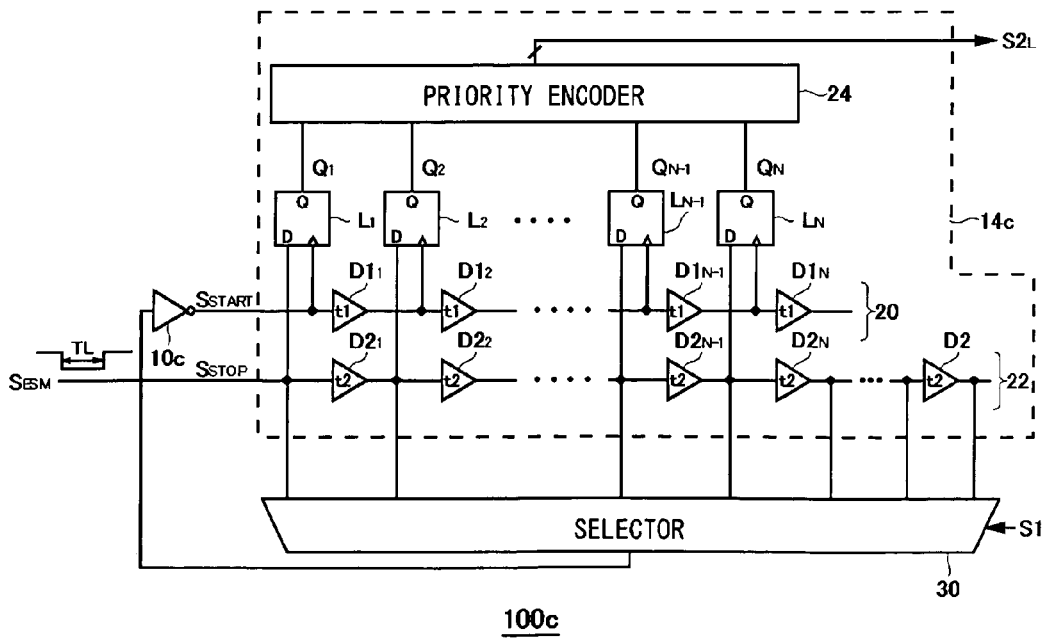

FIGS. 10A and 10B are circuit diagrams which show modifications of the first pulse width measurement circuit 100b and the second pulse width measurement circuit 100c employed in the configurations shown in FIGS. 8A and 8B.

A first pulse width measurement circuit 100b shown in FIG. 10A includes a first inverter 10b, a second inverter 28, a selector 30, and a time measurement circuit 14b.

The time measurement circuit 14b includes a first multi-stage delay circuit 20, a second multi-stage delay circuit 22, multiple latch circuits $L_1$ through $L_N$, and a priority encoder 24.

The first multi-stage delay circuit 20 includes N (N represents an integer) first delay elements $D1_1$ through $D1_N$ connected in a multi-stage manner, and applies a first predetermined delay t1 to the start signal $S_{START}$ at each stage. The second multi-stage delay circuit 22 includes N second delay elements $D2_1$, through $D2_N$ connected in a multi-stage manner, and applies a second predetermined delay t2 to the stop signal $S_{STOP}$ at each stage.

The relation between the delay amount t1 and the delay amount t2 satisfies the following Expression.

$$t1=\Delta t+t2$$

Here, Δt represents the resolution of the time measurement circuit 14.

The N latch circuits $L_1$ through $L_N$ are provided in increments of N pairs of the first delay element D1 and the second device element D2. The i'th latch circuit $L_i$ latches either the start signal $S_{START}$ input to the corresponding first delay element $D1_i$, or the stop signal $S_{STOP}$ input to the corresponding second delay element $D2_i$, at the timing of the positive edge included in the other signal. In FIGS. 10A and 10B, the stop signal $S_{STOP}$ is input to the data terminal of the latch circuit $L_i$, and the start signal $S_{START}$ is input to the clock terminal thereof.

The priority encoder 24 receives the output signals $Q_1$ through $Q_N$ from the N latch circuits $L_1$ through $L_N$. The output signals $Q_1$ through $Q_N$ are a so-called thermometer code. The priority encoder 24 converts the thermometer code into a binary code, thereby generating an output signal S2. It should be noted that, in a case in which such an arrangement includes a downstream circuit which is capable of processing the thermometer code, the priority encoder 24 can be eliminated.

The time difference between the start signal $S_{START}$ and the stop signal $S_{STOP}$ is reduced by $\Delta t = (t1-t2)$ every time the start signal $S_{START}$ and the stop signal $S_{STOP}$ pass through a single stage of the first and second delay elements D1 and D2 included in the first multi-stage delay circuit 20 and the second multi-stage delay circuit 22. In a case in which the initial time difference between the start signal $S_{START}$ and the stop signal $S_{STOP}$ is τ, the relation of the timing between the edges in the two signals is inverted when the two signals pass through the $(\tau/\Delta t)$'th stage delay elements.

Let us consider a case in which the stop signal $S_{STOP}$ has caught up with the start signal $S_{START}$ at the j'th (j is smaller than or equal to N) stage delay elements. In this case, the output signals $Q_1$ through $Q_j$ are set to 0. Furthermore, the output signals $Q_{j+1}$ through $Q_N$, which are output from the other delay elements downstream of the j'th stage delay elements at which the stop signal $S_{STOP}$ has caught up with the start signal $S_{START}$, are set to 1. The term "thermometer code" comes from the fact that, at a boundary point defined by a given bit, the data bits change from 1 to 0 (or 0 to 1), like a thermometer.

It should be noted that, in a case in which the stop signal $S_{STOP}$ has not caught up with the start signal $S_{START}$, all the bits of the thermometer code $Q_1$ through $Q_N$ are set to 0. On the other hand, in a case in which the stop signal $S_{STOP}$ has been input before the start signal $S_{START}$, all the bits are set to 1. These states can occur when the delay amount Tdelay1 exceeds the pulse width TH of the input pulse signal PULSE.

The first inverter 10b inverts the ESM signal $S_{ESM}$, and outputs the stop signal $S_{STOP}$. The selector 30 receives at least N output signals or input signals of the second delay elements, i.e., delayed stop signals $S_{STOP}$, selects one of these stop signals $S_{STOP}$ according to the delay control signal S1, and outputs the signal thus selected. Also, the selector 30 may further receive the input signals or output signals of the second delay elements D2 which are downstream of the N'th stage second delay element $D2_N$.

The second inverter 28 inverts the output signal of the selector 30, and outputs the start signal $S_{START}$.

In a case in which, in the first pulse width measurement circuit 100b shown in FIG. 10A, the selector 30 selects the output signal of the k'th stage second delay element $D2_k$, the start signal $S_{START}$ is a signal obtained by delaying the input pulse signal PULSE by τd=k×t2+Ti1+Ti2. Here, Ti1 and Ti2 represent the delay amounts provided by the first inverter 10b and the second inverter 28, respectively.

That is to say, in the first pulse width measurement circuit 100b shown in FIG. 10, the first inverter 10b, the second inverter 28, and the first stage through the k'th stage second delay elements $D2_1$ through $D2_k$ correspond to the delay circuit 12 shown in FIGS. 8A and 8B.

With the first pulse width measurement circuit 100b shown in FIG. 10A, the delay circuit 12 can be eliminated, as compared with the first pulse width measurement circuit 100b shown in FIG. 8A, thereby realizing a reduced circuit area. Furthermore, by switching the selected node using the selector 30, the delay amount Tdelay1 can be adjusted.

In a case in which, in the first pulse width measurement circuit 100b shown in FIG. 10, there is no need to adjust the delay amount Tdelay1, an arrangement may be made in which the selector 30 is eliminated, and the output signal of the k'th stage second delay element $D2_k$ is directly input to the second inverter 28.

The same modification can be applied to the second pulse width measurement circuit 100c which measures the low-level period shown in FIGS. 8A and 8B. FIG. 10B shows a modification of the second pulse width measurement circuit 100c. A second pulse width measurement circuit 100c shown in FIG. 10B includes a second inverter 10c, a selector 30, and a time measurement circuit 14c.

The ESM signal $S_{ESM}$ is input as the stop signal to the time measurement circuit 14c. The selector 30 receives the output signals or the input signals of the multiple second delay elements, i.e., the delayed stop signals $S_{STOP}$, selects one of these stop signals according to the delay control signal S1, and outputs the stop signal thus selected. The second inverter 10c inverts the output signal of the selector 30, and outputs the inverted signal as the start signal $S_{START}$.

With the second pulse width measurement circuit 100c shown in FIG. 10B, the delay circuit 12 can be eliminated, as compared with the second pulse width measurement circuit 100c shown in FIGS. 8A and 8B, thereby realizing a reduced circuit area. Furthermore, by switching the selected node using the selector 30, the delay amount Tdelay1 can be adjusted.

2. Second Embodiment

Description has been made in the first embodiment regarding an arrangement in which information is carried by both the positive edges and the negative edges included in the carrier signal $S_C$. Description will now be made below in the second embodiment regarding a modulation technique in which either the positive edges or the negative edges are delayed (description will be made below regarding an arrangement in which the negative edges are delayed) and the corresponding demodulation technique.

2.1 Modulator

Figure 11:
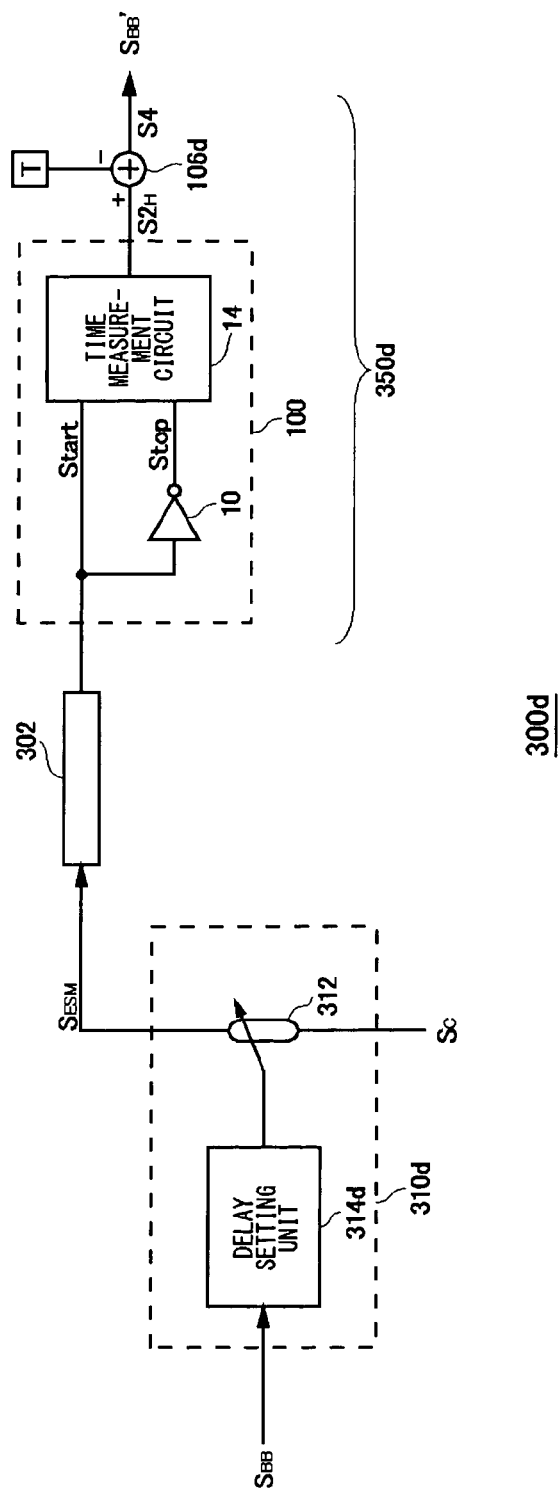
FIG. 11 is a block diagram which shows a configuration of a transmission system according to a second embodiment.

FIG. 11 is a block diagram which shows a configuration of a transmission system 300d according to the second embodiment. A modulator 310d shown in FIG. 11 includes a variable delay circuit 312 and a delay setting unit 314d.

The variable delay circuit 312 delays a carrier signal $S_C$ having a predetermined frequency. The delay setting unit 314d sets the delay period for the variable delay circuit 312 according to the base band signal $S_{BB}$ to be modulated. The delay setting unit sets the delay period according to the symbol value A included in the base band signal $S_{BB}$ at the timing at which an edge (negative edge in the present embodiment), which is selected from a positive edge and a negative edge, passes through the variable delay circuit 312. Furthermore, the delay period is set to a predetermined value which is independent of the symbol value, e.g., 0 at the timing at which an different edge that has not been selected (positive edge in the present embodiment) passes through the variable delay circuit 312.

Figure 12:
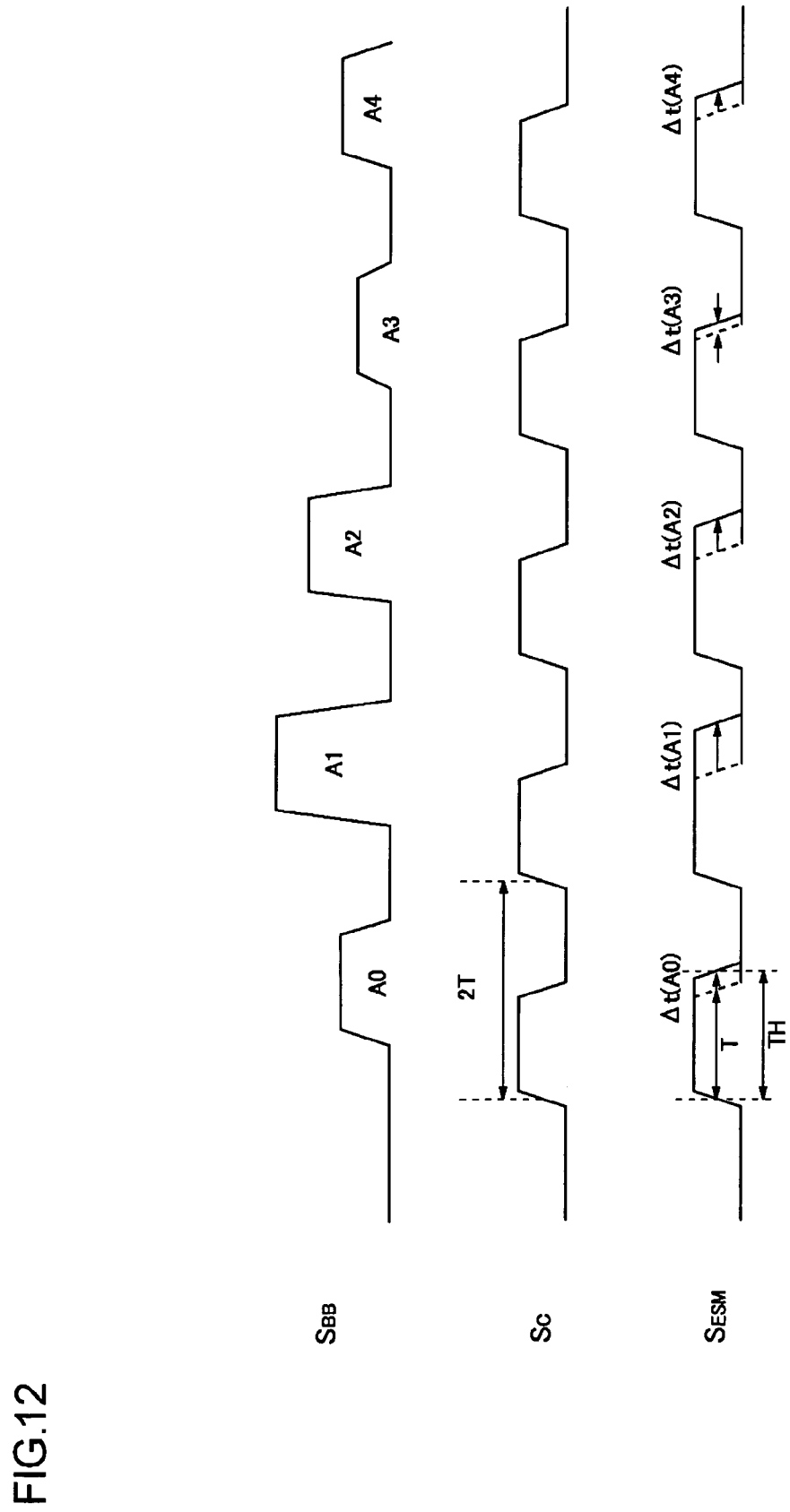
FIG. 12 is a waveform diagram which shows the ESM signal generated using a modulation method according to a second embodiment.

FIG. 12 is a waveform diagram which shows the ESM signal $S_{ESM}$ generated using the modulation method according to the second embodiment.

The base band signal $S_{BB}$ is shown in increments of symbols. Each of the negative edges included in the carrier signal $S_C$ is assigned to a single symbol A.

Synchronously with the carrier signal $S_C$, the delay setting unit 314d sets the delay amount Δt(A) according to the symbol value A included in the base band signal $S_{BB}$. By synchronizing the carrier signal $S_C$ and the base band signal $S_{BB}$ with each other, all the negative edges in the carrier signal $S_C$ can be used to carry information. With such an arrangement, the symbol rate $f_{SYM}$ of the base band signal $S_{BB}$ matches the frequency $f_C$ of the carrier signal $S_C$. It should be noted that an arrangement may be made employing the base band signal $S_{BB}$ and the carrier signal $S_C$ without synchronizing these signals with each other. Although such an arrangement employing the base band signal $S_{BB}$ and the carrier signal $S_C$ without synchronizing these signals with each other has the disadvantage of a reduced transmission rate, such an arrangement is also capable of transmitting a signal.

For example, the variable delay circuit 312 may set the delay amount $\Delta t(A)$ in proportion to the symbol value A. Also, the variable delay circuit 312 may set the delay amount $\Delta t(A)$ according to other rules that differ from the proportion rule.

With the ESM described in the present embodiment, only the negative edges in the carrier signal $S_C$ can be used to carry information, thereby providing high-speed data transmission.

The delay setting unit 314d shown in FIG. 11 may compensate for the delay amount to be applied to the negative edge, giving consideration to transmission loss in the transmission medium 302. With such an arrangement, the delay setting unit 314d may include a table which indicates the relation between the delay amount $\Delta t(A)$ to be applied to the negative edge and the compensation delay period $\tau_{COMP}$. Each process in the second embodiment can be understood with reference to the description of the first embodiment by substituting 0 for the values such as the data and the delay amount for the positive edge.

By adjusting the delay period so as to compensate for the pulse width, the second embodiment also improves the transmission rate, as in the first embodiment.

2.2 Demodulator

Next, returning to FIG. 11, description will be made regarding the configuration of the demodulator 350d according to the second embodiment. The demodulator 350d includes a first pulse width measurement circuit 100 and a subtractor 106d. The first pulse width measurement circuit 100 measures the high-level period TH of the modulated signal (ESM signal) $S_{ESM}$, i.e., the period from the positive edge up to the negative edge in the ESM signal $S_{ESM}$, and generates a first time difference signal $S2_H$ according to the high-level period TH thus measured. The first pulse width measurement circuit 100 has the same configuration as that shown in FIG. 1.

The subtractor 106d receives the first time difference signal $S2_H$, and demodulates the data signal (base band signal $S_{BB}$) based upon the first time difference signal $S2_H$ thus received. Specifically, the subtractor 106d subtracts the half cycle period T of the carrier signal $S_C$ from the pulse width TH indicated by the first time difference signal $S2_H$, and outputs a signal S4 according to the subtraction result. As can be clearly understood from FIG. 12, the signal S4 indicates the delay amount that corresponds to the symbol value A included in the base band signal $S_{BB}$. The demodulator 350d outputs the signal S4 as the demodulated base band signal $S_{BB}'$.

The demodulator 350d shown in FIG. 11 suitably demodulates the ESM signal $S_{ESM}$ in which only the negative edges are delayed.

Description has been made above regarding an arrangement in which the negative edges included in the carrier signal $S_C$ are delayed. Also, an arrangement may be made in which the positive edges are delayed. Such an arrangement can be understood with reference to the description of the modulator 310d by interchanging the negative edge and the positive edge. Furthermore, with such an arrangement, for the demodulator 350d, the second pulse width measurement circuit 100a shown in FIG. 1 should be employed, instead of the first pulse width measurement circuit 100. By measuring the low-level period (width of the negative pulse) in the ESM signal $S_{ESM}$, and by subtracting the half cycle period T from the low-level period thus measured, such an arrangement provides the shift amount of the positive edge.

Description has been made regarding the modulation/demodulation techniques according to the present invention with reference to the first and second embodiments. Lastly, description will be made regarding suitable applications of the modulation/demodulation techniques.

Figure 13:
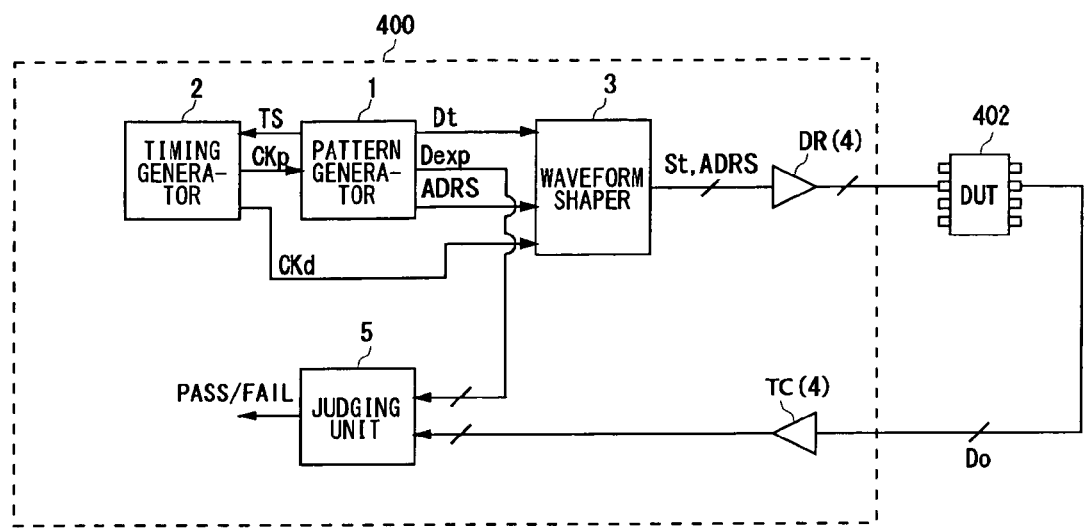
FIG. 13 is a block diagram which shows a configuration of a test apparatus using the modulator and the demodulator according to the embodiment.

FIG. 13 is a block diagram which shows a configuration of a test apparatus using the modulator and the demodulator according to the embodiment. A device under test 402 is memory, for example. A test apparatus 400 has a function of judging the quality of the device under test 402, or a function of identifying defective portions. It should be noted that the DUT is not restricted to memory. Rather, the DUT may be a desired device.

The test apparatus 400 includes a pattern generator 1, a timing generator 2, a waveform shaper 3, a driver DR, a comparator TC, and a judging unit 5. It should be noted that the configuration of the test apparatus 400 has been described for exemplary purposes only. Also, an architecture that differs from this configuration may be employed.

The pattern generator 1 generates a timing set signal (which will be referred to as the "TS signal" hereafter), and supplies the TS signal to the timing generator 2. The timing generator 2 generates a cycle clock CKp and a delay clock CKd based upon the timing data specified by the TS signal. The cycle clock CKp is supplied to the pattern generator 1, and the delay clock signal CKd is supplied to the waveform shaper 3. Then, the pattern generator 1 generates addresses ADRS for indicating each of the memory blocks, which are multiple storage areas, included in the DUT 402, and multiple test pattern data Dt to be written to the respective multiple blocks, and supplies the address ADRS and the test pattern data Dt to the waveform shaper 3.

Based upon the delay clock signal CKd supplied from the timing generator 2, the waveform shaper 3 generates a test pattern signal St that corresponds to the test pattern data Dt generated by the pattern generator 1. Then, the waveform shaper 3 supplies the address ADRS supplied from the pattern generator 1, and the test pattern signal St thus generated, to the DUT 402 via the writing driver DR.

Furthermore, the pattern generator 1 generates the expected value data Dexp which is the output data of DUT 402 to be output according to the address ADRS and the test pattern signal St, and supplies the expected value data Dexp to the judging unit 5.

The comparator TC reads out the data Do that corresponds to the address ADRS from the DUT 402, and outputs the data Do thus read out to the judging unit 5. The judging unit 5 judges the quality of the DUT 402 by making a comparison between the data Do read out from the DUT 402 and the expected value data Dexp supplied from the pattern generator 1.

For the test apparatus 400 having such a configuration, the modulator and the demodulator according to the embodiment can be used as follows.

1. First Usage Example

In a case in which the DUT 402 outputs the data Do in the form of an ESM signal, i.e., in a case in which an ESM modulator is employed on the DUT 402 side, a demodulator according to any one of the above-described embodiments is employed at a position downstream or upstream of the comparator TC.

2. Second Usage Example

In a case in which the DUT 402 is configured such that it is capable of receiving either the test pattern signal St or the address signal ADRS in the form of an ESM signal, or such that it is capable of receiving both the test pattern signal St and the address signal ADRS in the form of ESM signals, i.e., in a case in which an ESM demodulator is employed on the DUT 402 side, a modulator according to any one of the above-described embodiments is employed in the waveform shaper 3.

3. Third Usage Example

ESM may be employed in communication between the internal function blocks included in the test apparatus 400, regardless of whether or not the DUT 402 employs ESM for transmission/reception of data to/from an external circuit. For example, at least one of (3.1) the signal transmission between the pattern generator 1 and the timing generator 2; and (3.2) the signal transmission between the timing generator 2 and the waveform shaper 3 requires high-speed, a modulator should be provided to the transmitting side, and a demodulator should be provided to the receiving side. The distance between the internal function blocks included in the test apparatus 400 is fixed once the test apparatus 400 is designed. Thus, the above-described pulse-width compensation techniques for the modulator can be suitably employed.

While the preferred embodiments of the present invention have been described using specific terms, such description is for illustrative purposes only, and it is to be understood that changes and variations may be made without departing from the spirit or scope of the appended claims.

What is claimed is:

1. A modulation method comprising:
generating a data signal to be modulated;
generating a carrier signal at a predetermined frequency;
assigning each symbol in the data signal to any one of positive edges or negative edges in the carrier signal;
delaying a positive edge in the carrier signal by a delay period according to a symbol value in the data signal assigned to the positive edge, and delaying a negative edge in the carrier signal by a delay period according to a symbol value in the data signal assigned to the negative edge, thereby generating a modulated signal.

2. A modulation method according to claim 1, further comprising processing in which, when the modulated signal is generated, the delay period to be applied to at least one of the positive edge and the negative edge is adjusted giving consideration to loss in a transmission line via which the modulated signal is transmitted.

3. A modulation method according to claim 1, further comprising processing in which, when the modulated signal is generated, the delay period to be applied to at least one of the positive edge and the negative edge is adjusted according to the pulse width of the modulated signal obtained as the modulation result.

4. A modulation method according to claim 1, further comprising processing which is performed when the modulated signal is generated,
wherein the processing comprises:
calculating the difference between the delay period to be applied to a given edge according to the corresponding data signal and the delay period to be applied to the edge which precedes the given edge according to the corresponding data signal;
determining a compensation period according to the difference thus calculated; and
compensating for the delay period, which is to be applied to the given edge according to the corresponding data signal, using the compensation period, and applying the delay period thus compensated to the given edge.

5. A modulator comprising:
a variable delay circuit which outputs a modulated signal by delaying a carrier signal having a predetermined frequency; and
a delay setting unit which sets the delay period for the variable delay circuit according to a data signal to be modulated,
wherein the delay setting unit assigns each symbol included in the data signal to any one of positive edges and negative edges included in the carrier signal,
and wherein the delay setting unit sets a delay period for the variable delay circuit at the timing at which a given positive edge in the carrier signal passes through the variable delay circuit, according to a symbol value in the data signal assigned to the positive edge,
and wherein the delay setting unit sets a delay period for the variable delay circuit at the timing at which a given negative edge in the carrier signal passes through the variable delay circuit, according to a symbol value in the data signal assigned to the negative edge.

6. A modulator according to claim 5, wherein the delay setting unit adjusts the delay period to be applied to at least one of the positive edge and the negative edge, giving consideration to loss in a transmission line via which the modulated signal is transmitted.

7. A modulator according to claim 6, wherein the delay setting unit includes:
a delay element which delays the data signal, which is sequentially input, by one cycle;
a computation unit which calculates the difference between a delay period that corresponds to the data signal which has not been delayed and a delay period that corresponds to the data signal which has been delayed;
a compensation period determination unit which determines a compensation period based upon the difference thus calculated by the computation unit; and
a delay compensation unit which compensates for the delay period that corresponds to the data signal which has not been delayed, using the compensation period thus determined by the compensation period determination unit, thereby determining the compensated delay period,
wherein the delay period for the variable delay circuit is set to the compensated delay period.

8. A modulator according to claim 7, wherein the compensation period determination unit includes a table which stores the relation between the aforementioned difference and the compensation period.

9. A modulator according to claim 8, wherein the table is determined based upon the pulse width of the modulated signal output from the variable delay circuit and the pulse width of the modulated signal which reaches the demodulation circuit via the transmission line.

10. A modulator according to claim 5, wherein the delay setting unit sets the delay period in proportion to the value of the data signal.

11. A modulator comprising:
- a variable delay circuit which outputs a modulated signal by delaying a carrier signal having a predetermined frequency; and
- a delay setting unit which sets a delay period for the variable delay circuit according to a data signal to be modulated,
- wherein the delay setting unit sets a delay period for the variable delay circuit according to a symbol value in the data signal at the timing at which one edge in the carrier signal, selected from a positive edge and a negative edge, passes through the variable delay circuit,
- and wherein the delay setting unit sets a delay period for the variable delay circuit to a predetermined value independent of a symbol value in the data signal at the timing at which the other edge which has not been selected passes through the variable delay circuit.

12. A modulator according to claim 11, wherein the delay setting unit adjusts the delay period to be applied to an edge that belongs to the selected edge class, giving consideration to loss in a transmission line via which the modulated signal is transmitted.

* * * * *